United States Patent [19]

Ohno et al.

[11] Patent Number: 4,899,020

[45] Date of Patent: Feb. 6, 1990

[54] PRINTED WIRING UNIT FOR HORN SWITCH

[75] Inventors: Satoshi Ohno, Inazawa; Tetsushi Hiramitsu, Ichinomiya, both of Japan

[73] Assignee: Toyoda Gosei Co., Ltd., Nishikasugai, Japan

[21] Appl. No.: 236,182

[22] Filed: Aug. 25, 1988

[30] Foreign Application Priority Data

Oct. 19, 1987 [JP] Japan .............................. 62-159837[U]
Dec. 26, 1987 [JP] Japan ................................ 62-330986

[51] Int. Cl.$^4$ .............................................. H05K 1/00
[52] U.S. Cl. .................................................... 174/258
[58] Field of Search ........................................ 174/258

[56] References Cited

U.S. PATENT DOCUMENTS

| | | | |
|---|---|---|---|
| 3,932,689 | 1/1976 | Watanabe et al. | 174/68.5 X |
| 4,254,172 | 3/1981 | Takahashi et al. | 174/68.5 X |
| 4,263,341 | 4/1981 | Martyniak | 174/68.5 X |
| 4,611,261 | 9/1986 | Suwa | 174/68.5 X |
| 4,751,126 | 6/1988 | Oodaira et al. | 174/68.5 X |
| 4,759,970 | 7/1988 | Seeger, Jr. et al. | 361/397 X |
| 4,772,496 | 9/1988 | Maeda et al. | 428/35 |

*Primary Examiner*—Morris H. Nimmo
*Attorney, Agent, or Firm*—Cushman, Darby & Cushman

[57] ABSTRACT

The present invention relates to printed wiring units to be used for horn switches and others, comprising an insulative base made of resin strong in corrosion resistance against an etching reagent to be used in pre-treatment for plating, a pattern base being shaped in substantially the same with the printed wiring pattern disposed on said insulative base and being made of resin weak in corrosion resistance against said etching reagent and a conductive plating layer formed on said pattern base.

The present invention also relates to horn switches provided on steering wheels of automobiles, comprising a base plate in a pad portion a protruding horn contact extending through the upper surface of a housing disposed on said base plate and operating in correspondence with the movement of a horn button on a pad portion, a contact member of said horn contact protruded on the side of said base plate, a biasing member disposed between said base plate and said horn contact to urge said horn contact to be spaced apart from the base plate and being conductable to said contact member, one electrode portion disposed on said base plate and being conductive to said biasing member and the other electrode disposed on said base plate at a lower position than the electrode portion described above to be conductive upon contact with said contact member while not in constant contact with said biasing member.

4 Claims, 4 Drawing Sheets

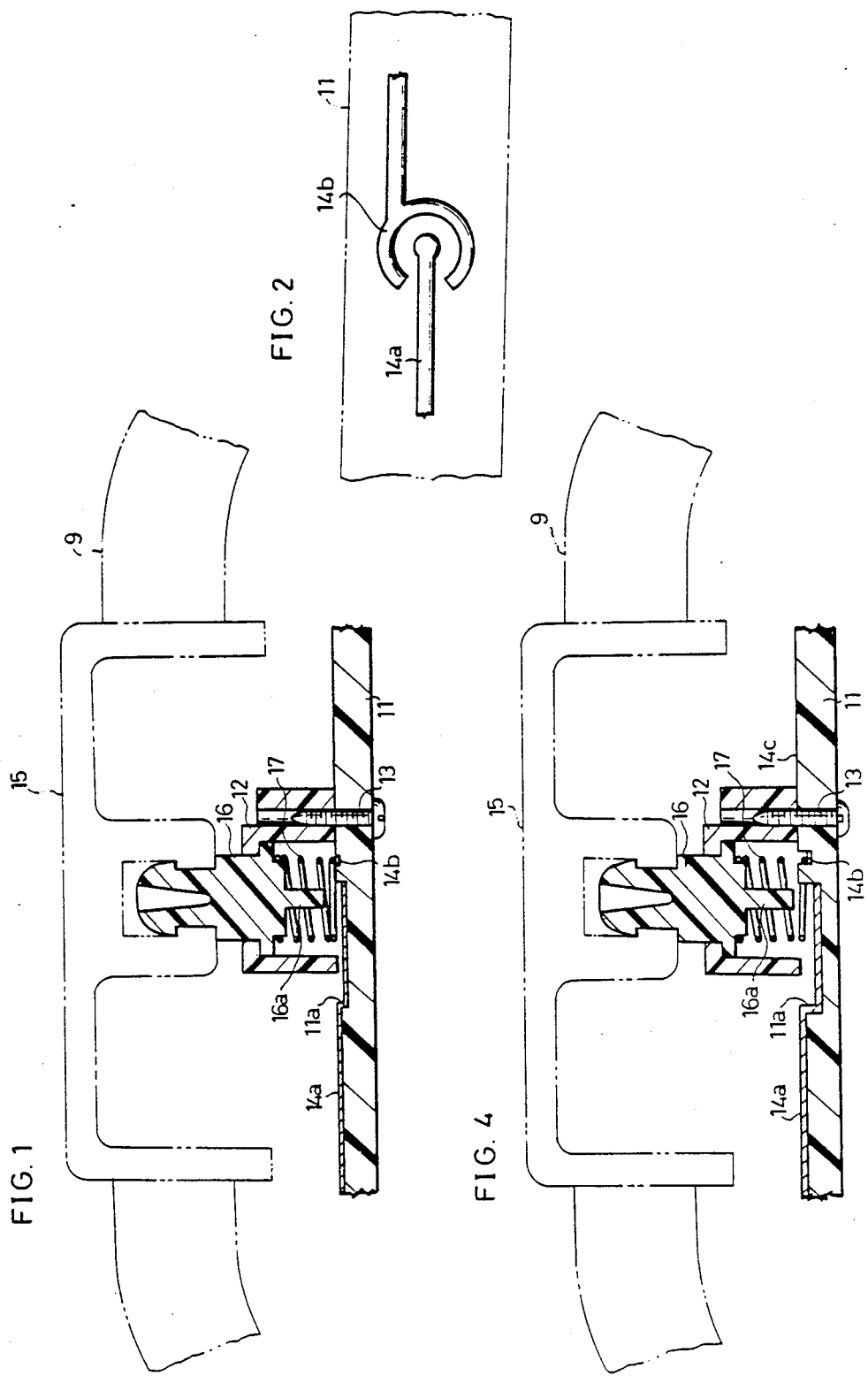

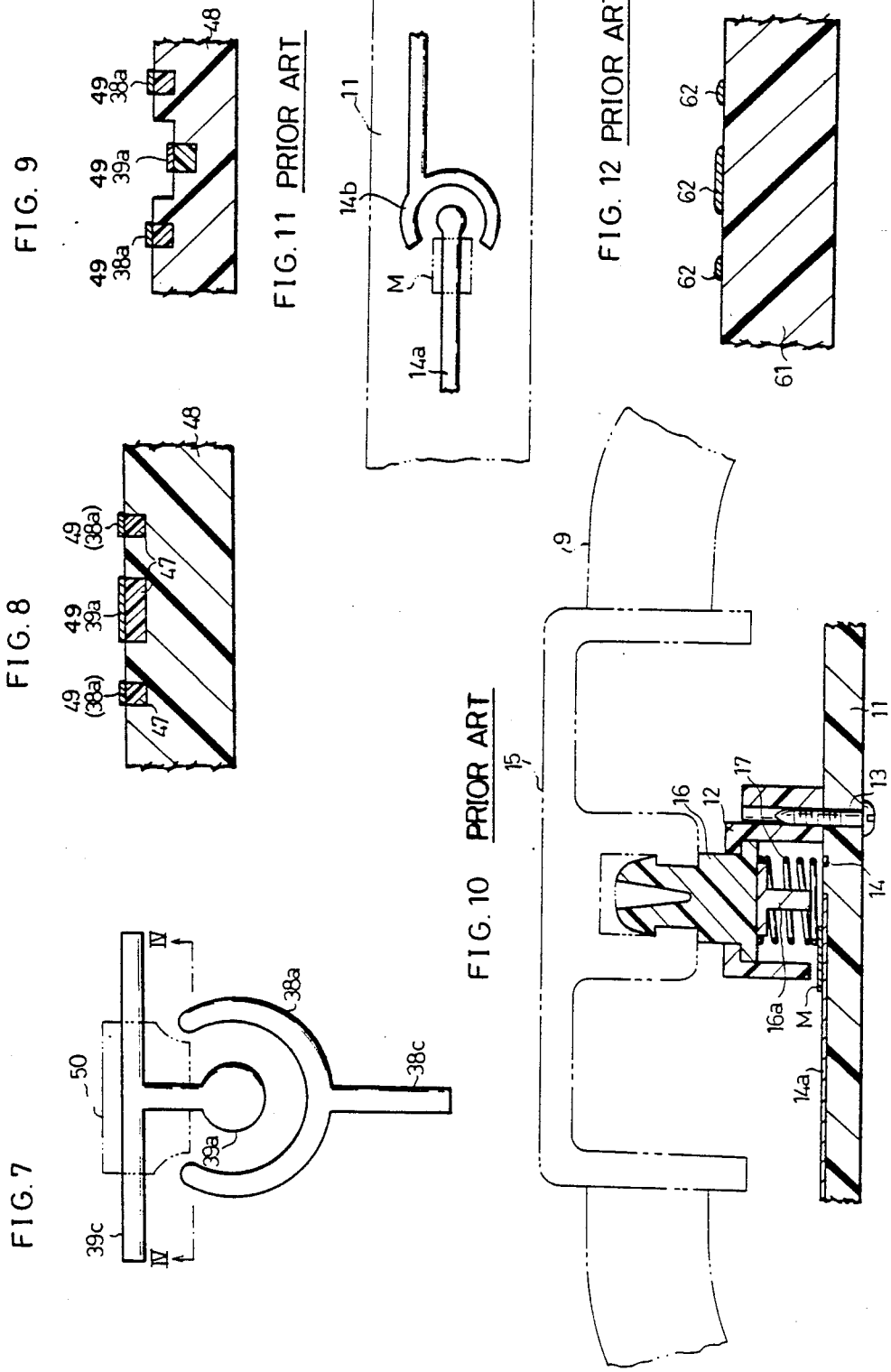

PRINTED WIRING UNIT FOR HORN SWITCH

BACKGROUND OF THE INVENTION

1. Filed of the Invention

The present invention relates to horn switches provided on steering wheels of automobiles and wiring units used for horn switches, display apparatuses, interior wiring and others provided in vehicles such as passenger cars and the like.

2. Description of the Related Art

Conventional horn switches of such structure as shown in FIG. 10 are known. Namely a base plate 11 is disposed at the bottom inside a horn button 15 which is provided on a pad portion 9 at the center part of a steering wheel. A housing 12 is provided on said base plate 11. On the surface of said base plate 11, as shown in FIG. 10 and FIG. 11, an electrode portion 14a is formed extending from the one end portion on said base plate 11 to the central portion in said housing 12. The other electrode portion 14b is formed extending from the other end portion on said base plate 11 in a shape of an arc so as to encircle said electrode portion 14a.

On the upper surface of said housing 12, a horn contact 16 is protruded therethrough, the upper portion of which contacts said horn button 15. On the under surface of the horn contact 16, a contact member 16a formed in a shape of a letter T at cross-sectional view is fixed. On the outer peripheral portion of said contact member 16a, a spring 17 is provided. A masking material M covers a partial area of the electrode portion 14a on the surface of said base plate 11 where a part of said spring 17 contacts.

Moreover, in various parts of a vehicle such as a horn switch, a base plate of a display unit of tail lamps and others, wiring connects the switch, the display portion, the tail lamps and others with the power source. It is troublesome in using a connectional electric wire to connect the end portions thereof with the given terminals. Especially, where a large number of terminals are disposed, there is a problem that the volume of electric wires becomes large and the apparatus becomes big as a whole. Therefore, printed wiring has been used for switches on steering wheels which are equipped with electric circuits. Further, as shown in FIG. 12, as an inexpensive method of manufacturing printed wiring, it is throughout that wiring patterns formed by ink for selective plating (which has properties of selectively plating inked portions) are transcribed on a base 61 made of resin. And then, wiring patterns 62 of copper, nickel and others are formed by applying electroless plating on pattern portions.

In a conventional horn switch as mentioned above, since the electrode portions 14a and 14b are formed on the same plane, the masking material M is required for preventing a portion of the spring 17 to contact the one electrode portion 14a on the base plate 11, which would cause the electrode portions 14a and 14b to be conductive.

Due to the thickness of the masking material M, the spring 17 partially contacts the other electrode 14b on the base plate 11. Also, the contact portion of the spring 17 with the other electrode 14b on the base plate 11 can not be enlarged due to the masking material M. These are problems. And another problem was to increase the manufacturing cost by using the masking material M.

In the foregoing method of preparing printed board with wiring patterns and using the same, there was a problem that printed boards used for electric circuit were expensive. Also, the number of parts to be used increased and assembly manhours increased too, resulting in the increase of the manufacturing cost. In the method of employing the ink for selective plating, on the other hand, there was a defect that the boundary between the base and the inked portion by transcribing was obscure and the process was complicated. When the surface of the base which patterns are formed thereon is curved or irregular, transcribing of the ink for selection plating was not well performed.

SUMMARY OF THE INVENTION

It is an object of the present invention to provide a horn switch which secures contact of a spring with an electrode portion, can enlarge an electrode portion which contacts a spring and reduces the manufacturing cost thereof.

It is another object of the present invention to provide a wiring unit on which the wiring patterns are clearly formed, the processes are not many, the manufacturing cost is low and the formation of the wiring patterns on the curved bases or the bases with irregular surfaces can be easily performed.

To achieve the foregoing objects, the horn switch according to the present invention is constituted of a base plate disposed in a pad portion, a horn contact protruded therethrough on the upper surface of a housing which is provided on said base plate and operating in correspondence with the movement of a horn button on said pad portion, a contact member protruded on the under surface of said horn contact, a biasing member disposed between said base plate and said horn contact to urge said horn contact to be spaced away from the base plate while being conductive with said contact member, one electrode portion disposed on said base plate to conduct with said biasing member and the other electrode portion disposed on said base plate at a lower position than the one of the above-mentioned electrode portion, thereby contacting said contact member to be conductive and not contacting said biasing member.

Further, the wiring unit according to the present invention comprises an insulated base made of resin having a strong anti-corrosive property against the etching reagent used in pretreatment for plating, pattern bases made of resin having a weak anti-corrosive property against said etching reagent and formed on said insulated base in a shape of substantially the same with the wiring patterns, and plating layers formed on said pattern bases.

Other objects of the present invention will become apparent with an understanding of the embodiments described later, and as clarified in the appended claims. Further, many advantages not mentioned in this specification will become obvious to one skilled in the art upon application of the present invention.

BRIEF DESCRIPTION OF THE DRAWINGS

FIGS. 1 to 4 show the embodiments and modifications of the present invention, wherein FIG. 1 is a sectional view of a horn switch, FIG. 2 is a plan view showing the electrode portions on the base plate, FIG. 3 is a sectional view of a steering wheel including a horn switch and FIG. 4 is a horn switch in a modification of the present invention. FIG. 7 is a partial plan view of the wiring pattern. FIG. 8 is a partially sectional view of the wiring pattern. FIG. 9 is a sectional view along line IV—IV of FIG. 7. FIGS. 10, 11 and 12 are the views showing the prior art, wherein FIG. 10 is a sectional view of a horn switch, FIG. 11 is a plan view showing the electrode portions on the base plate and FIG. 12 is a sectional view of the wiring pattern according to the prior art.

DETAILED DESCRIPTION OF THE PREFERRED EMBODIMENTS

First Embodiment

An embodiment realizing the present invention in horn switches which are provided on steering wheels of automobiles is described below with reference to FIGS. 1 to 3.

Figure 3:
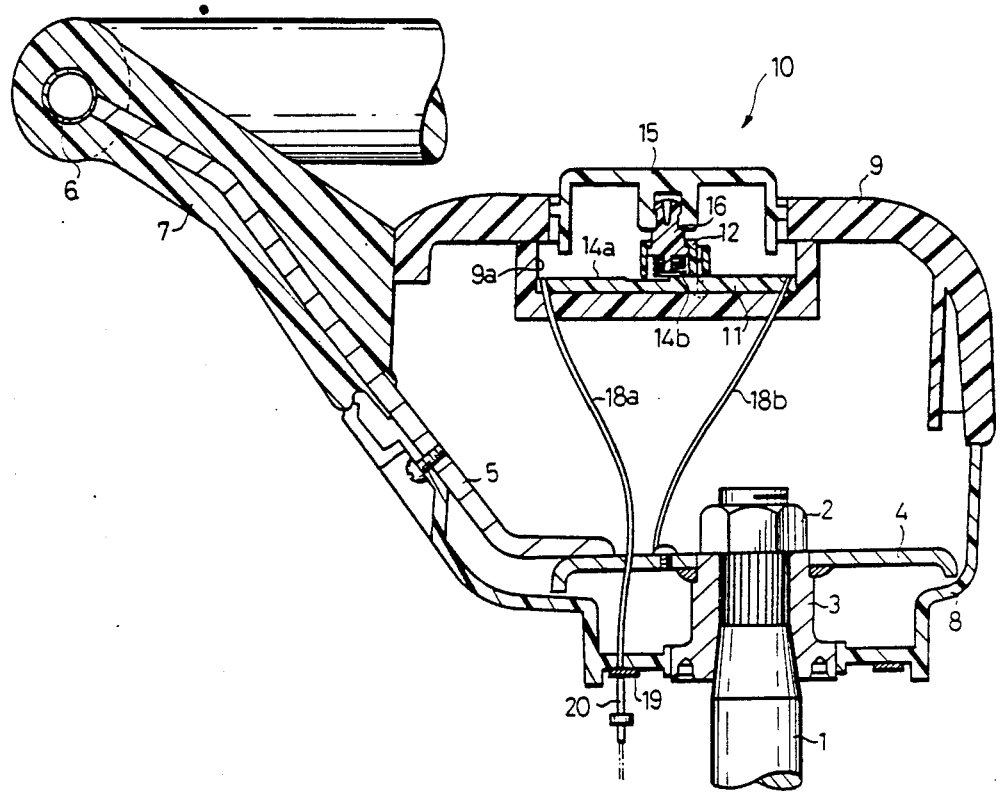

As shown in FIG. 3, a boss plate 4 is welded on the outer peripheral portion of a boss portion 3 where a steering shaft 1 is fitted in and secured by means of a nut 2. On said boss plate 4, a core metal 5 of the spoke portion is welded and a core metal 6 of the pipe-shaped ring portion is attached to the tip of said core metal 5 of the spoke portion. The outer peripheries of said core metal 5 of the spoke portion and said core metal 6 of the ring portion are covered by a cover layer 7 made of synthetic resin.

At the under surface side of said boss plate 4, a lower cover 8 made of synthetic resin is screwed such as to cover said plate 4. At the upper portion of said lower cover 8, a pad portion 9 made of synthetic resin is attached such as to cover the upper surface side of said boss plate 4 and others. At the central portion of said pad portion 9, a recess 9a is formed, wherein a horn switch 10 which is constituted as described below is provided.

As shown in FIG. 1, a housing 12 is secured by means of a screw 13 on a base plate 11 made of synthetic resin such as ABS resin (an acrylonitrile-butadiene-styrene copolymer), polyamide resin (6-nylon) and others, which is attached to the bottom of said recess 9a.

On the surface of said base plate 11, a recess 11a is formed, where a plus-side electrode portion 14a is formed by means of electroless plating extending from one side of the surface of said base plate 11 (left side of FIG. 1) of said recess 11a.

The other electrode 14b of minus-side is extended from the other end of the surface of the base plate 11 (right side of FIG. 1) to the central portion of the housing 12. As shown in FIG. 2, said electrode portion 14b is formed by means of electroless plating such as to encircle said electrode portion 14a in a shape of an arc.

Electroless plating for formation of said electrode portions 14a and 14b is performed first by means of covering with the masking material the portions except the electrode portions 14a and 14b. Next, the phosphorus alloys such as nickel-boron (Ni-B) alloy, nickel-phosphorus (Ni-P) alloy and others as well as the copper alloys are used for plating under the given conditions such as plating fluid concentration, PH, temperature, time and other.

On the upper surface of said housing 12, a horn contact 16, the upper portion of which ocntacts a horn button 15, is protruded therethrough. A contact member 16a of a letter T shape at the cross section is formed integrally with the under section of the horn contact 16. A spring 17 is disposed at the outer peripheral portion of said contact member 16a between said base plate 11 and the horn contact 16 to press said horn contact upwardly. The under portion of said spring 17 is adapted to contact the one electrode portion 14b but not to contact the other electrode portion 14a which is formed in the recess 11a on said base plate 11 due to the difference of elevation.

A lead wire 18a is connected with the end portion (left end in FIG. 3) of said electrode portion 14a. The lead wire 18a is connected with a slip ring 19 mounted on the under surface of said lower cover 8.

Said slip ring 19 is conducted to a control pin 20 which is provided on the column side of the steering wheel. Said contact pin 20 is connected with a horn and the drive circuit thereof. On the other hand, a lead wire 18b is connected with the end portion of the electrode portion 14b (right end portion in FIG. 3). Said lead wire 18b is connected with the boss plate 4 and then grounded through the steering shaft 1.

Next, the operation of the horn switch 10 constituted as described above is explained and its effects are mentioned.

As shown in FIG. 1, when the horn button 15 is not pressed, the contact member 16a of the horn contact 16 is in a state of non-contact with the electrode portion 14a on the base plate 11.

The spring 17 is also in a state of non-contact with the electrode portion 14a while it is in a state of contact with the whole portion formed in a shape of an arc of the other electrode portion 14b.

When the horn button 15 is pressed, the horn contact 16 is pushed down by the pressing force and in opposition to the urging force of the spring 17. Next the under surface of the contact member 16a contacts the electrode portion 14a. Thus, the electrode portions 14a and 14b are conducted through the intermediary of the contact member 16a of the horn contact 16 and the spring Hence, the electricity is conducted from the contact pin 20 being connected with a not-shown horn to the steering shaft 1 through the slip ring 19, the lead wire 18a, the electrode portion 14a, the contact member 16a, the spring 17, the other electrode portion 14b, the other lead wire 18b and the boss plate 4 to operate the horn.

When the pressing force on the horn button 15 is released, the under surface of the contact member 16a of the horn contact 16 comes off the electrode portion 14a. Thus, the conductivity of the electrode portion 14a with the other electrode portion 14b is released to suspend the operation of the horn.

In the horn switch 10 of this embodiment, as mentioned above, the position of the electrode portion 14a is placed lower than the position of the electrode portion 14b, thereby the conventional masking material is not required. Subsequently, as shown in FIG. 2, the arc portion of the electrode portion 14b can be formed larger than the conventional one, resulting in the improvement of the performance and reliability of the horn switch 10, leading to the reduction of the manufacturing cost.

Second Embodiment

Next, an embodiment of the present invention which is concretized in the printed wiring unit for the horn switch of the steering wheel is described below with reference to the drawings.

Figure 5:
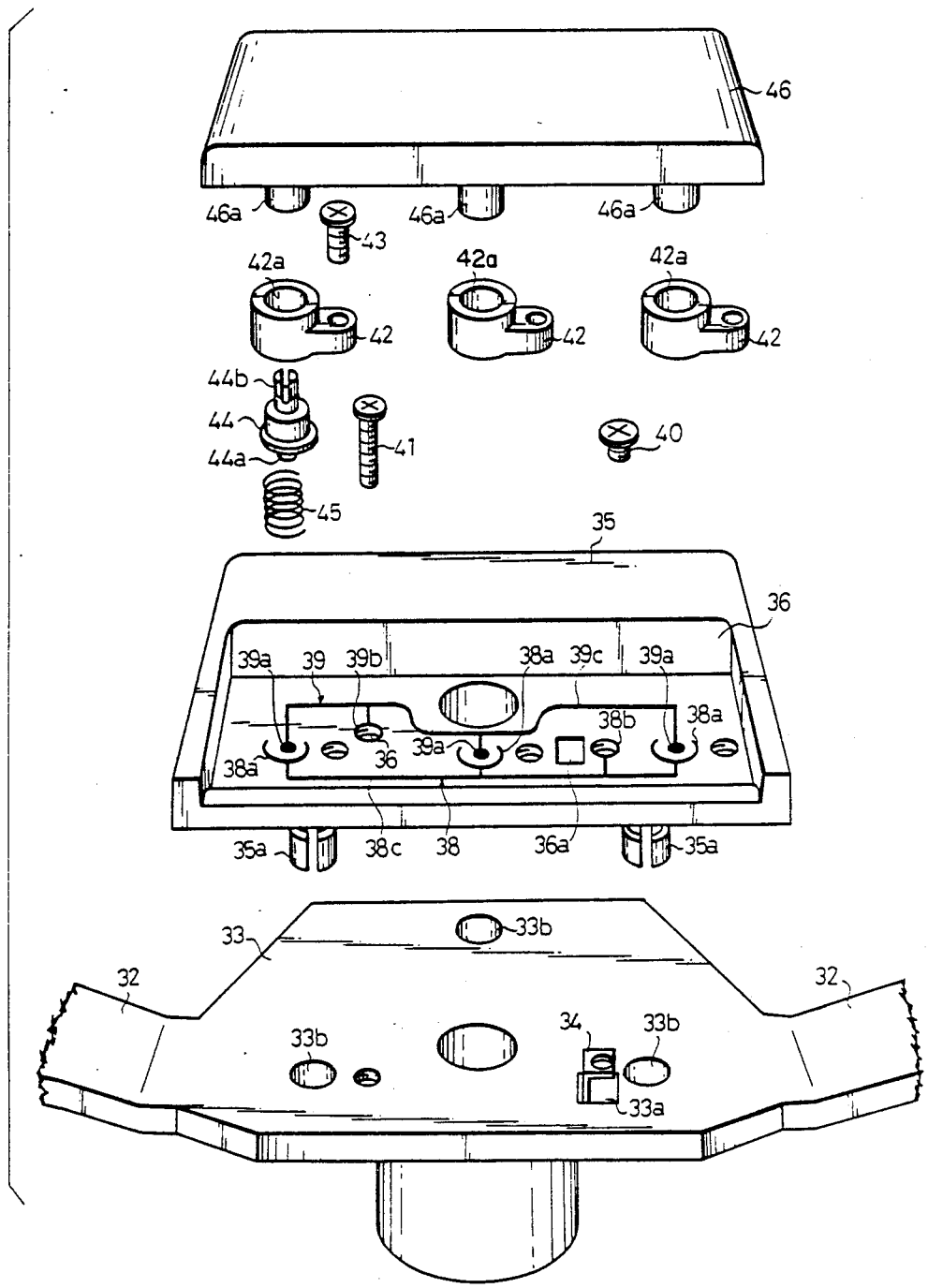
FIG. 5 is an exploded perspective view showing the assembling state of a horn switch.

As shown in FIG. 5, a boss 33 formed integrally with spokes 32 is secured to the upper portion of the steering shaft (not shown). Through a bore 33a formed on said boss 33, a contact ring terminal 34 of a contact ring provided on the column (not shown) side of the steering wheel protrudes.

On the boss 33, fitting bores 33b are formed to be fitted in by fitting projections 35a protruded on the under surface of a pad 35. On said pad 35, a receiving recess 36 is formed close to the front side of the upper surface thereof, wherein a horn switch 37 is provided. On the bottom surface of the receiving recess 36, a plus-side printed wiring pattern comprising terminal portions 38a and 38b and a printed wiring portion 38c formed integrally with the terminal portions 38a and 38b is provided. Similarly, a minus-side printed wiring pattern 39 comprising terminal portions 39a and 39b and a printed wiring portion 39c formed integrally with the terminal portions 39a and 39b is provided on the same bottom surface of the receiving recess 36 with the terminal portions 38a and 39a facing each other. The terminal portion 38b of the plus-side printed wiring pattern 38 is secured to the contact ring terminal 34 by passing the contact ring terminal 34 through a bore 36a formed in the receiving recess 36 and projecting therein by means of a screw 40. On the other hand, the terminal portion 39b of the minus-side printed wiring pattern 39 is adapted to contact the head of a screw 41 to be screwed in a threaded bore for gounding conductivity by means of said screw 41.

Figure 6:
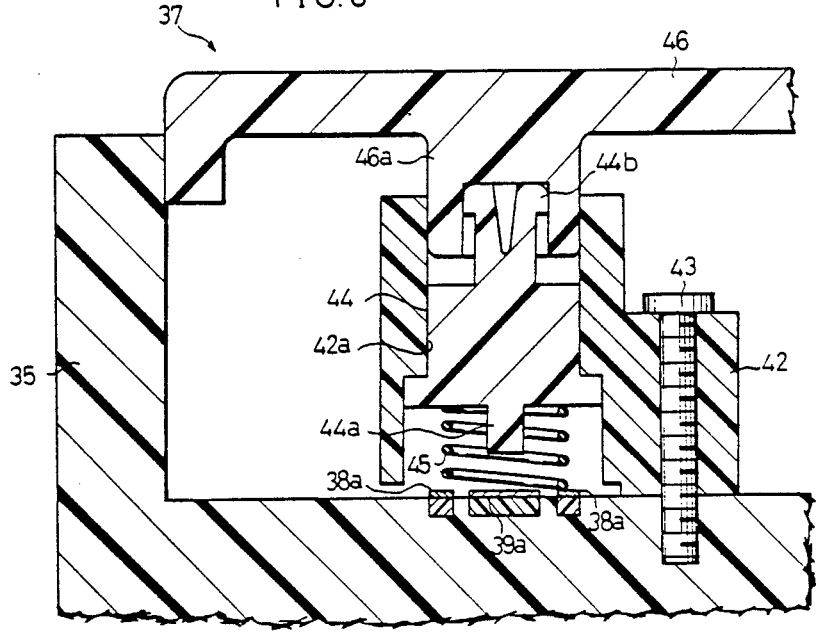
FIG. 6 is a sectional view showing the important portions of a horn switch.

As shown in FIG. 6, movable contact guides 42 are fixed by means of screws 43 so the terminals 38a and 39a are positioned in the guide bores 42a on the bottom surface of the receiving recess 36 corresponding to of said printed wiring pattern 38 and 39. Movable contacts 44 having contact portions 44a which may contact terminals 39a of said minus-side printed wiring pattern 39 are inserted in the guide bores 42a so as to be vertically slidable. Said contact portions 44a are maintained spaced apart from the terminals 39a by the urging force of the spring. Fitting portions 44b of the movable contacts 44 are coupled and fixed wtih fitting portions 46a of a horn button 46 so as to be integrally movable with the movable contact 44. The movable contacts 44 made of resin are covered by metal all over the surfaces thereof. The springs 45 are made of steel or phosphor bronze, the surface of which is plated with silver. The lower end of said spring 45 is positioned so as to contact only the terminal 38a of the plus-side printed wiring pattern 38.

As shown in FIG. 8, pattern bases 47 made of ABS resin are buried in the same shape as the printed wiring patterns 38 and 39 in the receiving recess 36 of the pad 35, wherein the pad 35 constitutes an insulative base 48. On the surface of said pattern bases 47, conductive plating layers 49 are formed.

Formation of the patterns is performed by insertion fabrication or embedding the pattern bases 47 in the insulative base 48.

Next, an example of the plating method of the pad 35 where the printed wiring patterns formed by the pattern bases 47 made of ABS resin are buried in the insulated base 48 made of polycarbonate is described below.

First, the pad 35 is washed by a PH 11 to 12 alkali solution of sodium hydroxide, sodium phosphate or both. After washing, the pad 35 is dipped for 2 to 6 minutes at 70° C. in an etchant containing chromic acid (420 g/l) and concentrated sulfuric acid (380 g/l). Thus, the surface of the pattern base 47 is etched to make the plating layer easily adherable to the pattern base 47. After washing, the pad is dipped in hydrochloric acid for 30 seconds at room temperature and then washed again. By this hydrochloric acid treatment, chromic acid is removed. Then, the pad is dipped for 30 to 90 seconds at 25° C. in a solution containing A-30 catalyst 20 cc/l (made by Okuno Pharmaceutical Industrial Co., Ltd.) including palladium chloride and stannous chloride as principal components and concentrated hydrochloric acid 180 cc/l and then washed. Thus, metallic palladium which is required as a catalyst in the electroless plating process adheres to the surface of the pattern base 47.

Next, the pad is dipped for 3 minutes at 40° C. in an aqueous solution of concentrated hydrochloric acid 70 cc/l and washed. Then, the pad is dipped for 5 minutes at 35° C. in the nickel plating bath with sodium hypophosphite as a reducing agent. Thus, the nickelling layer is formed on the surface of the pattern base 47. By washing and drying the pad, a series of plating treatments is completed.

Next, the operation of the horn switch constituted as described above is explained and the effects are mentioned.

As shown in FIG. 5, the printed wiring patterns 38 and 39 are integrally formed as a printed wiring unit in the receiving recesses 36 of the pad 35. Accordingly, the assembling of the pad 35 with the boss 33 secured on the upper portion of the steering shaft and the assembling of the movable contact guides 42, the movable contacts 44, the horn button 46 and so on with the receiving recess 36 of the pad 35 are completed. Thus, the horn switch 37 assembly is completed. Therefore, the conventional wiring work is not necessary.

As shown in FIG. 6, in a state of the horn button 46 being not pressed, the terminals 38a of the plus-side printed wiring pattern 38 are electrically connected with the movable contacts 44 through the spring 45.

On the other hand, the contact portions 44a of the movable contacts 44 are not contacted with the terminals 39a of the minus-side printed wiring pattern 39. And the adjacent area of the terminal 39a is insulated by the green mask 50 (shown in FIG. 7) and others so as to prevent the conductivity with the spring 45. Another method of insulationis to form a difference in level as shown in FIG. 9 which is the same as the first embodiment mentioned above. Accordingly, the circuit for operating the horn is maintained in a nonoperative open state.

When the horn button 46 is pressed, themovable contact 44 is lowered by the pressing force, simultaneously opposing the urging force of the spring 45, and the contact portion 44a contacts the terminal 39a of the printed wiring pattern 39. Thus, the terminal 38a of the plus-side printed wiring pattern 38 and the terminal 39a of the minus-side printed wiring pattern 39 are conductive through the intermediaries of the spring 45 and the movable contacts 44. The circuit for operating the horn is closed to operate the horn.

The present invention is not limited to the above embodiments but can be realized in the following.

(1) In the first embodiment described above, the horn contact 16 and the contact member 16a are integrally formed but they may be divided to each form a separate piece. In the same embodiment, they are made of resin which is covered by metal all over the surface through electroless plating. However, only the portion where electrical conductivity is required, such as the surface of the contact member 16a and the lower portion of the horn contact 16, may be covered by metal.

Further, electroplating or other methods of covering metal may be appropriately applied.

(2) In the first embodiment described above, the position of the arc-shaped electrode portion 14b which the spring 17 contacts on the surface of the base plate 11 can be formed lower than the general surface 14c (the surface of the base plate 11 at the outer peripheral portion of the electrode portion 14b) as shown in FIG. 4. In this case, the position of the electrode portion 14a (the position below the contact member 16a) must be lower than the position of the electrode portion 14b.

(3) In the first embodiment described above, the electrode portions 14a and 14b can be formed by applying a conductive ink on the portions requiring electrical activity of the electrode portions 14a and 14b through screen printing method as an alternative to the electroless plating employed in the first embodiment.

(4) In the second embodiment described above, the combination of the pattern base 47 and the insulative base 48 can be made by etching the pattern base 47 with an etchant such as a combination of chromic acid and concentrated sulfuric acid. Examples of suitable pattern base 47 and insulative base 48 combinations include polyacetal and ABS resin or nylon and ABS resin.

As the metal for formation of the plating layer 49, not only nickel but copper or silver or others can be used; however the conditions of plating are varied according to the kind of the metal employed in the pattern base 47, the insulative base 48 and the conductive plating layer 49. In the embodiment described above, the example embodied in the printed wiring pattern for the horn switch is explained but it can be applied to the tail lamp or realized in the wiring structure of the display board such as metals.

Inasmuch as it is apparent that the present invention can be realized in a wide range of embodiments without departing from its spirit and scope, the realizations of the present invention are not limited to those stated in the appended claims.

What is claimed is:

1. A printed wiring unit comprising:
   an insulative base made of resin strong in corrosion resistance against an etching reqgent to be used in pre-treatment for plating,
   a printed wiring pattern disposed on said insulative base
   said base defining recesses for said wiring pattern disposed therein,
   a pattern base being shaped substantially the same as said printed wiring pattern, molded so as to inlay within said recesses of said insulative base, and being made of resin weak in corrosion resistance against said etching reagent used in pre-treatment for plating, and
   a conductive plating layer formed on said pattern base.

2. A printed wiring unit according to claim 1, wherein said insulative base is made of polycarbonate and said pattern base is made of ABS resin.

3. A printed wiring unit according to claim 1, wherein said insulative base is made of ABS resin and said pattern base is made of polyacetal.

4. A printed wiring unit according to claim 1, wherein said insulative base is made of nylon and said pattern base is made of nylon.

* * * * *